United States Patent
Lee et al.

(10) Patent No.: US 9,457,426 B2
(45) Date of Patent: Oct. 4, 2016

(54) METHOD OF MANUFACTURING MASK

(71) Applicant: Samsung Display Co., Ltd., Yongin-City, Gyeonggi-Do (KR)

(72) Inventors: Doh-Hyoung Lee, Guri-si (KR); Jun Ho Jo, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 474 days.

(21) Appl. No.: 14/021,700

(22) Filed: Sep. 9, 2013

(65) Prior Publication Data
US 2014/0291306 A1 Oct. 2, 2014

(30) Foreign Application Priority Data
Mar. 29, 2013 (KR) ........................ 10-2013-0034662

(51) Int. Cl.
*B23K 26/00* (2014.01)
*C23C 16/04* (2006.01)
*B23K 26/06* (2014.01)
*B23K 26/08* (2014.01)
*B23K 26/12* (2014.01)
*C23C 14/04* (2006.01)
*B23K 26/40* (2014.01)

(52) U.S. Cl.
CPC ....... *B23K 26/0093* (2013.01); *B23K 26/0648* (2013.01); *B23K 26/082* (2015.10); *B23K 26/0853* (2013.01); *B23K 26/127* (2013.01); *B23K 26/364* (2015.10); *B23K 26/40* (2013.01); *C23C 14/042* (2013.01); *C23C 16/042* (2013.01); *B23K 2201/18* (2013.01); *B23K 2203/04* (2013.01); *B23K 2203/50* (2015.10)

(58) Field of Classification Search
CPC .......... B23K 26/0093; B23K 26/0648; B23K 26/0853; B23K 26/127; B23K 26/364; B23K 26/082; B23K 26/04
See application file for complete search history.

(56) References Cited

U.S. PATENT DOCUMENTS

| 5,509,556 A * | 4/1996 | Balz ................ B23K 26/40 216/56 |
| 2006/0091125 A1* | 5/2006 | Li .................. B23K 26/0622 219/121.69 |
| 2008/0254555 A1* | 10/2008 | Cok .................. H01L 51/0011 438/22 |
| 2010/0193485 A1* | 8/2010 | Anukhin ............ B23K 26/16 219/121.72 |
| 2012/0017981 A1 | 1/2012 | Chung et al. |
| 2013/0092555 A1* | 4/2013 | Haluck .................. C23F 1/02 205/661 |

FOREIGN PATENT DOCUMENTS

| JP | 06-179087 A | 6/1994 |
| JP | 2011-031282 A | 2/2011 |
| JP | 2012-077328 A | 4/2012 |
| KR | 10-0687486 B1 | 2/2007 |
| KR | 10-1023396 B1 | 3/2011 |
| KR | 10-2012-0009679 A | 2/2012 |

* cited by examiner

*Primary Examiner* — Thien S Tran
(74) *Attorney, Agent, or Firm* — Knobbe Martens Olson & Bear LLP

(57) ABSTRACT

A mask substrate that includes a first area and a second area surrounding the first area is provided. Then, a laser beam is irradiated on the mask substrate to at least partly remove a material of the second area. After that, a physical force is applied to the mask substrate to separate the first area from the mask substrate thereby forming an opening through the mask substrate.

10 Claims, 9 Drawing Sheets

METHOD OF MANUFACTURING MASK

CROSS-REFERENCE TO RELATED APPLICATION

This U.S. non-provisional patent application claims priority under 35 U.S.C. §119 of Korean Patent Application No. 10-2013-0034662, filed on Mar. 29, 2013, the contents of which are hereby incorporated by reference in its entirety.

BACKGROUND

1. Field of Disclosure

The present disclosure relates to a method of manufacturing a mask. More particularly, the present disclosure relates to a method of manufacturing a mask using a laser beam.

2. Discussion of the Related Technology

In general, a mask is used to pattern a thin film layer formed on a substrate and includes an opening pattern formed therethrough to correspond to the pattern of the thin film layer. The mask is widely used to pattern thin film layers formed on a semiconductor device or a display panel.

Meanwhile, when an organic electroluminescent display panel is manufactured, a metal mask is used to form an organic light emitting layer of the organic electroluminescent display panel using an evaporation method. The metal mask may be a fine metal mask (FMM) with a thin thickness and provided with openings formed therethrough to correspond to pixels of the organic electroluminescent display panel. Accordingly, when the metal mask is disposed on the substrate and the evaporated organic material is provided to the substrate and the metal mask, the organic material is deposited on the substrate in accordance with positions of the openings.

In general, the openings are formed by performing a wet etch process on the metal mask. However, as the metal mask increases in size and thickness, the openings of the metal mask are difficult to be precisely formed as designed by using the wet etch process, and a time required to form the openings is increased.

SUMMARY

The present disclosure provides a method capable of easily manufacturing a mask using a laser beam.

Embodiments of the inventive concept can provide a method of manufacturing a mask. A mask substrate that includes a first area and a second area surrounding the first area when viewed in a thickness direction of the mask substrate is provided. Then, a laser beam is irradiated on the mask substrate to at least partly remove a material of the second area. After that, a physical force is applied to the mask substrate to separate the first area from the mask substrate, thereby forming an opening through the mask substrate.

Embodiments of the inventive concept can further provide a method of manufacturing a mask. A mask substrate that includes a first area and a second area surrounding the first area when viewed in a thickness direction of the mask substrate is provided. Then, a laser beam is irradiated on the mask substrate to at least partly remove a material of the second area such that the first area is separated from the mask substrate.

According to the above, the first area or unprocessed portion is divided from the mask substrate by irradiating the laser beam onto the second area or processing portion, and then, the unprocessed portion is separated from the mask substrate by applying the physical force to the unprocessed portion. As a result, the mask having the opening is formed. Therefore, the amount of the laser beam irradiated onto the mask substrate when the unprocessed portion is separated by forming the recess using the laser beam is smaller than the amount of the laser beam irradiated onto the mask substrate when the unprocessed portion is removed by irradiating the laser beam onto the first area. As a result, the mask substrate may be protected from overheating and deformation while the mask substrate is processed by using the laser beam, so that the mask substrate may be more precisely processed. In addition, a time required to manufacture the mask may be reduced.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
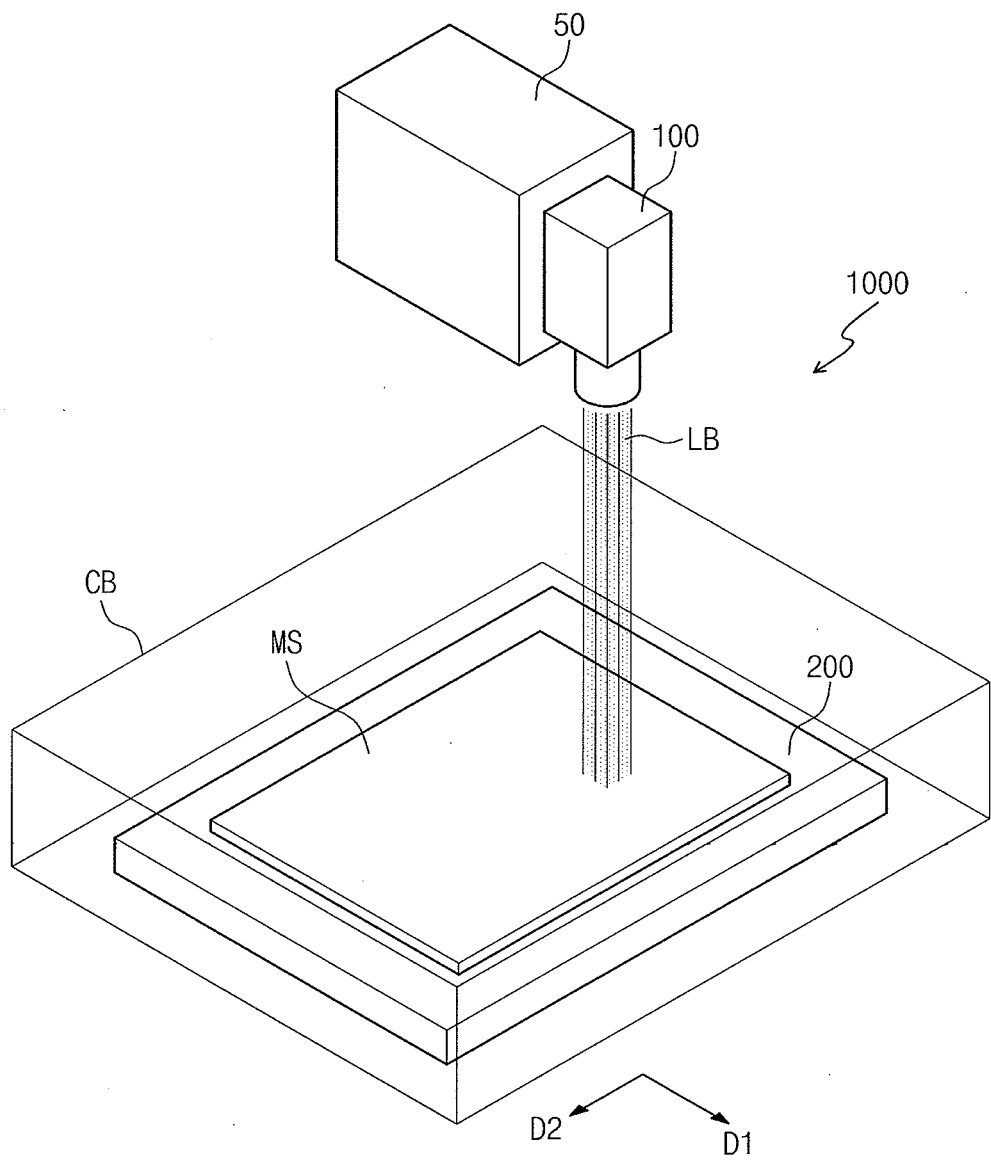
FIG. 1 is a perspective view showing a mask manufacturing apparatus according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

FIG. 1 is a perspective view showing a mask manufacturing apparatus 1000 according to an exemplary embodiment of the present disclosure.

Figure 2A:
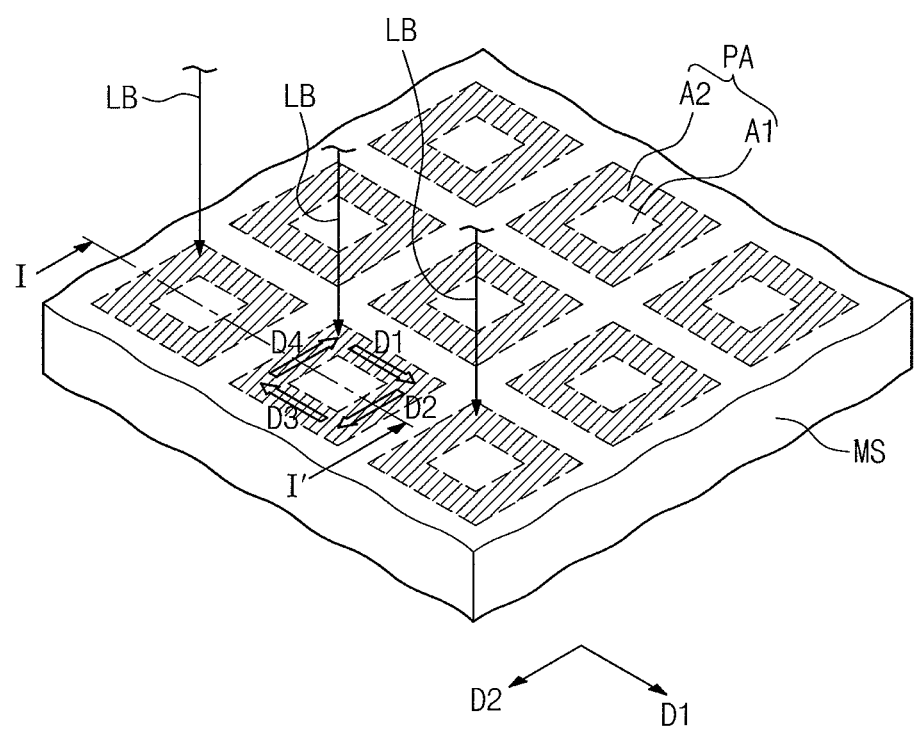
FIGS. 2A to 2F are views showing a method of manufacturing a mask using the mask manufacturing apparatus shown in FIG. 1.
Figure 2B:
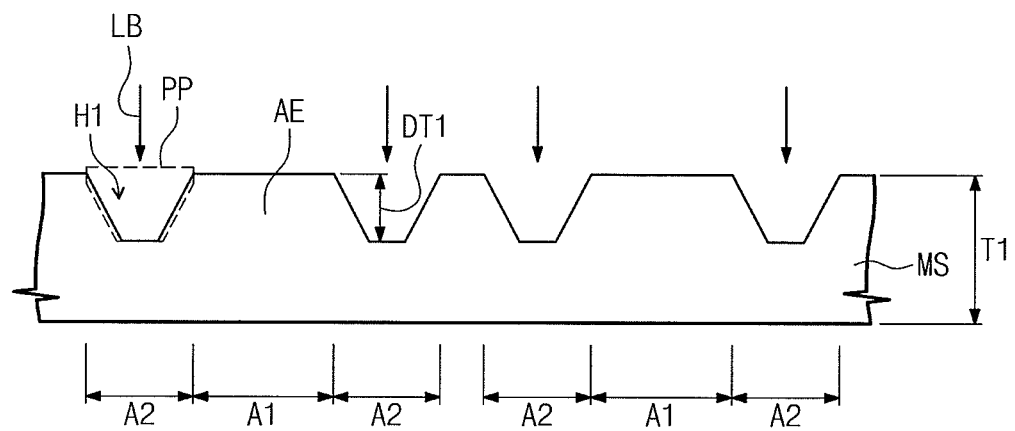
Figure 2C:
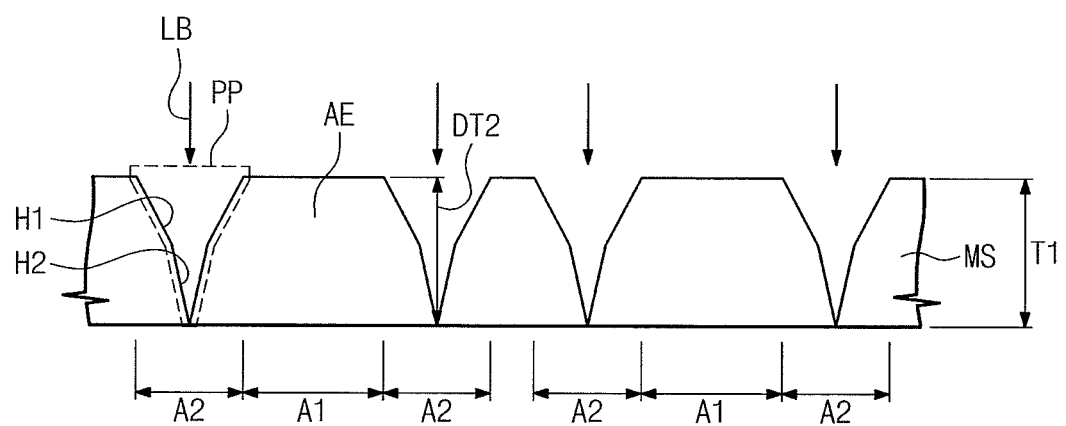
Figure 2D:
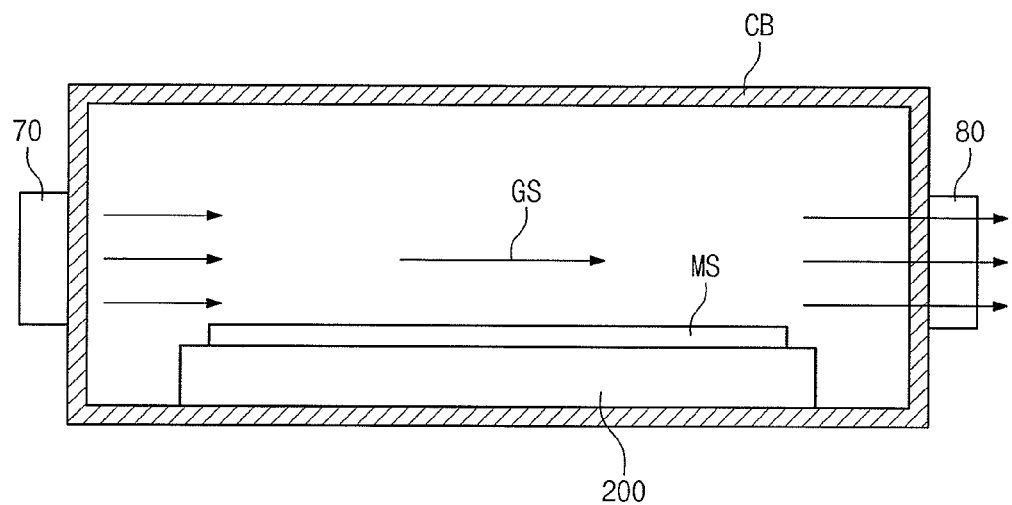
Figure 2E:
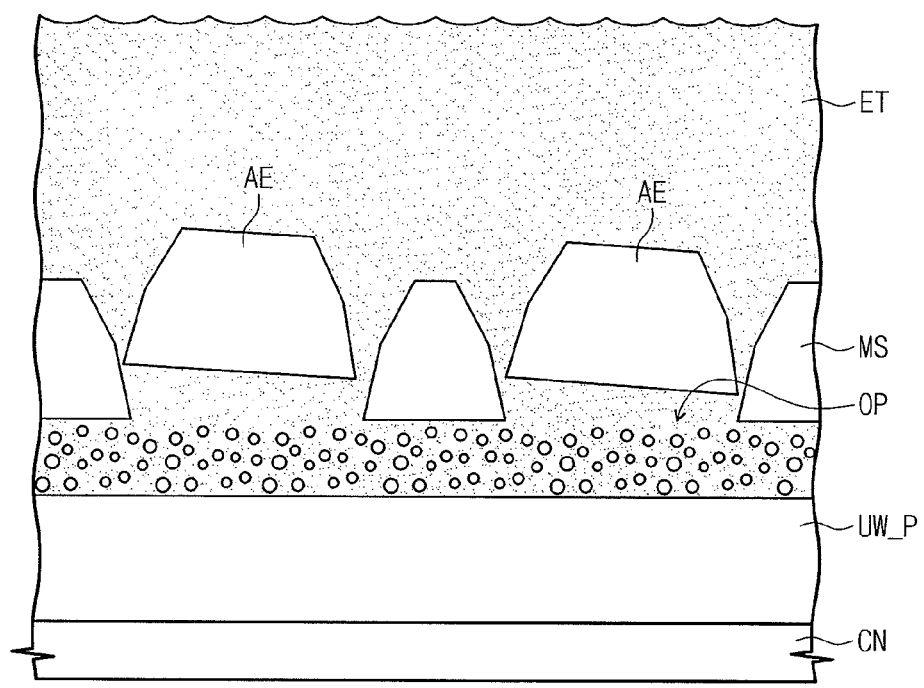
Figure 2F:
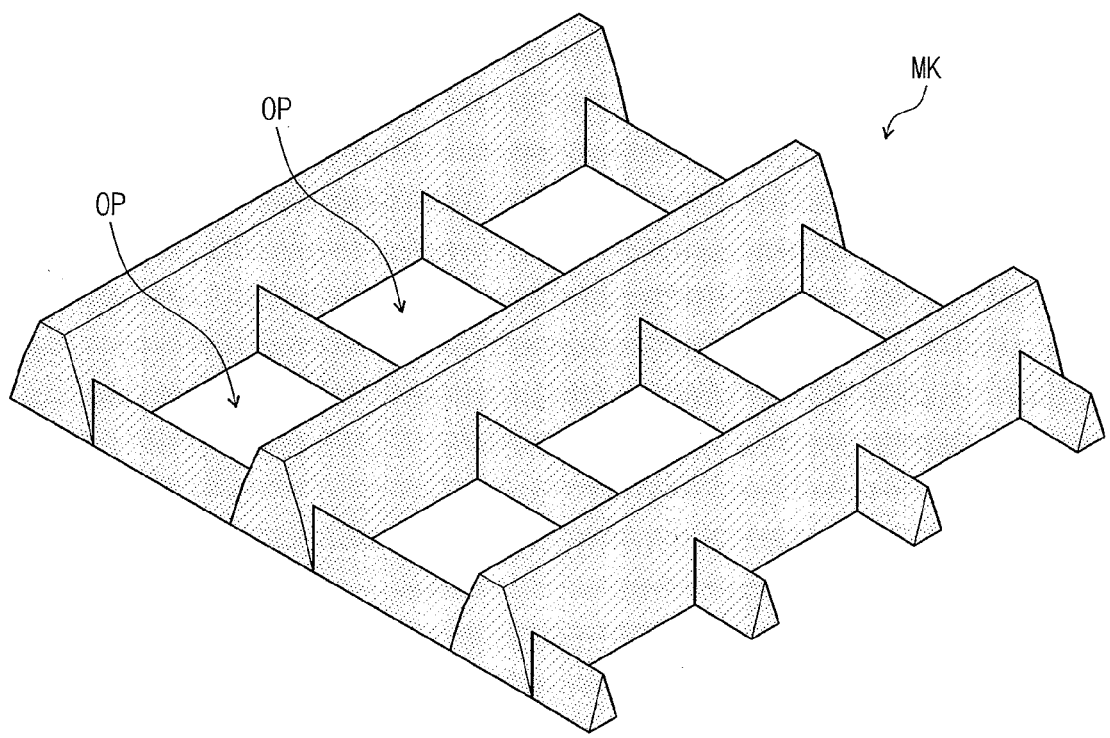

Referring to FIG. 1, the mask manufacturing apparatus 1000 is used to process a mask substrate MS which is a plate material and manufacture a mask MK (refer to FIG. 2F). Here, the mask MK is used to pattern an organic light emitting layer of an organic electroluminescent display device. In detail, the organic light emitting layer is formed by depositing an evaporated organic material on a substrate, and the mask MK is disposed on the substrate to define a position in which the evaporated organic material is deposited. This will be described in detail with reference to FIG. 4.

The mask manufacturing apparatus 1000 includes a chamber CB, a laser beam generator 50, a laser beam irradiator 100, and a stage 200. The chamber CB includes a space therein to receive the mask substrate MS. The chamber CB is formed of a transparent material, e.g., glass, to transmit a laser beam LB.

The laser beam generator 50 and the laser beam irradiator 100 are disposed above the chamber CB. The laser beam generator 50 receives a source voltage and generates the laser beam LB, and the laser beam LB generated by the laser beam generator 50 is provided to the laser beam irradiator 100. In the present exemplary embodiment, the laser beam LB may be, but not limited to, a microwave with a pulse width of about 10 picoseconds.

The laser beam irradiator 100 condenses the laser beam LB and controls the laser beam LB to allow the laser beam LB to travel toward the mask substrate MS. To this end, the laser beam irradiator 100 may include an optical lens, such as a focusing lens, an f-theta lens, etc. As an example, the laser beam irradiator 100 may be a galvano scanner.

In addition, the laser beam irradiator 100 may include a beam splitting element to split the laser beam LB into a plurality of laser beams. For instance, the beam splitting element may be, but not limited to, a diffractive optical element (DOE) lens. In this case, the DOE lens divides the laser beam LB into the laser beams using a diffraction phenomenon.

Meanwhile, the laser beam generator 50 and the laser beam irradiator 100 should not be limited to the above-mentioned configurations.

The stage 200 is disposed in the chamber CB and the mask substrate MS is disposed on the stage 200. In the present exemplary embodiment, the mask manufacturing apparatus 1000 may further include an actuator or a driver (not shown) coupled to the stage 200 to move the stage 200. In this case, the stage 200 moves to a first direction D1, a second direction D2, or opposite directions to the first and second directions D1 and D2 by the driver in the chamber CB. Therefore, the position of the mask substrate MS, at which the laser beam LB is irradiated, may be easily controlled by moving the stage 200.

The mask substrate MS is a plate material required to manufacture the mask MK (refer to FIG. 2F) using the mask manufacturing apparatus 1000. The mask substrate MS is formed of a metal material, e.g., a stainless steel, and has a thickness in a range from a few micrometers to hundreds of micrometers. In one embodiment, the thickness is from about 1 micrometer to about 1000 micrometers. In another embodiment, the thickness is from about 10 micrometers to about 100 micrometers. In another embodiment, the thickness is about 50 micrometers. Hereinafter, a method of manufacturing the mask MK using the mask manufacturing apparatus 1000 will be described in detail with reference to FIGS. 2A to 2F.

FIGS. 2A to 2F are views showing the method of manufacturing the mask using the mask manufacturing apparatus shown in FIG. 1. In embodiment, a laser ablation process can be used for partly or completely removing selected portions of the mask substrate. The mask substrate MS includes plural processing areas PA, but a portion of the mask substrate MS including some processing areas PA are shown in FIGS. 2A to 2F.

Referring to FIG. 2A, the mask substrate MS has a plate shape with a flat upper surface and includes the processing areas PA spaced apart from each other. Each of the processing areas PA includes a first area A1 and a second area A2 surrounding the first area A1 when viewed in a thickness direction of the mask substrate. Each of the processing areas PA has a rectangular shape, but not limited thereto. The processing areas PA have a shape corresponding to that of openings OP (refer to FIG. 2F) formed through the mask MK (refer to FIG. 2F).

As described above, in the case that the first area A1 has the rectangular shape, the second area A2 has a closed-loop shape to surround the first area A1. The second area A2 is irradiated with the laser beam to process the mask substrate MS. That is, the laser beam LB is irradiated onto the mask substrate MS along the second area A2 to partially remove the material of the mask substrate MS.

In embodiments, since the laser beam LB is split into the laser beams by the laser beam irradiator 100 described with reference to FIG. 1, the laser beams LB may be simultaneously irradiated onto two or more second areas A2 of the processing areas PA. In embodiments, when the laser beam LB is irradiated onto the second area A2, the stage 200 supporting the mask substrate MS moves, and thus the laser beam LB may be continuously irradiated along the first direction D1, the second direction D2, the third direction D3 opposite to the first direction D1, and the fourth direction D4 opposite to the second direction D2.

The cross-sectional view taken along a line I-I' shown in FIG. 2A has been shown in FIG. 2B after the laser beam LB is irradiated onto the second area A2 along the first, second, third, and fourth directions D1, D2, D3, and D4.

Referring to FIG. 2B, when the laser beam LB is irradiated onto the second area A2, a first recess H1 is formed in the mask substrate MS corresponding to the second area A2. In detail, when a portion of the mask substrate MS corresponding to the second area A2 is referred to as a processing portion or laser-ablation portion PP, the processing portion PP is removed from the upper surface thereof along a thickness direction thereof, and thus the first recess H1 is formed.

As shown in FIG. 2B, the first recess H1 is formed to have side surfaces inclined with respect to the thickness direction of the mask substrate MS when viewed in a cross section. That is, a width of the first recess H1 becomes smaller as it is closer to a bottom surface of the mask substrate MS.

When assuming that the process of forming the first recess H1 in the processing portion PP using the laser beam LB is a first processing process, the first processing process is performed for several times by irradiating the laser beam LB onto the processing process PP. For instance, the processing portion PP is removed by about 0.5 micrometers when the laser beam LB is irradiated once, and thus the laser beam LB is required to be irradiated onto the processing portion PP through a few to tens of times, thereby forming the first recess H1. In addition, when the mask substrate MS has a first thickness T1, the first recess H1 has a first depth DT1 smaller than the first thickness T1 of the mask substrate MS after the first processing process is finished.

Referring to FIG. 2C, after the first processing process or first laser ablation process is finished, the laser beam LB is further irradiated onto the processing portion PP to perform a second processing process or second laser ablation process on the processing portion PP. As a result, a second recess H2 is formed in the processing portion PP to be connected to the first recess H1. Similar to the first processing process, the second processing process is performed by irradiating the laser beam LB onto the processing portion PP several times.

In the present exemplary embodiment, the second recess H2 is formed to have side surfaces inclined with respect to the thickness direction of the mask substrate MS when viewed in a cross section. That is, a width of the second recess H2 becomes smaller as it is closer to the bottom surface of the mask substrate MS. Here, the second recess H2 has a V-shape when viewed in a cross section. In embodiments, an angle between the side surface of the second recess and the thickness direction may be smaller than that between the side surface of the first recess and the thickness direction.

After the second processing process is finished, a portion of the processing portion PP is removed to have a second depth DT2 substantially the same as the first thickness T1 of the mask substrate MS due to the first recess H1 and the second recess H2. In addition, when a portion of the mask substrate MS, which is surrounded by the processing portion PP, is referred to as an unprocessed portion AE, the unprocessed portion AE can be separated from the mask substrate MS after the laser beam LB is irradiated onto the processing portion PP along the second area A2, i.e., along the closed-loop shape.

Thus, after the second processing process is finished, the mask substrate MS and the unprocessed portion AE are disconnected from each other, and thus the unprocessed portion AE is removed from the mask substrate MS. However, although the second processing process is finished, the unprocessed portion AE may be not completely disconnected from the mask substrate MS. In embodiments, when the second processing process is finished, a portion of the processing portion PP is removed to have a second depth DT2 slightly smaller than the first thickness T1 of the mask substrate MS due to the first recess H1 and the second recess H2. In these embodiments, an additional process is required to apply a physical force to the unprocessed portion AE to completely remove the unprocessed portion AE from the mask substrate MS. This will be described in detail with reference to FIGS. 2D and 2E.

In addition, a volume of the removed material to form the first recess H1 and the second recess H2, which are formed by irradiating the laser beam LB, may be smaller than that of the unprocessed portion AE. Accordingly, an amount of the laser beam LB irradiated onto the mask substrate MS when the unprocessed portion AE is removed by forming the first and second recesses H1 and H2 using the laser beam LB is smaller than an amount of the laser beam LB irradiated onto the mask substrate MS when the first area is removed by irradiating the laser beam LB onto the first area. Therefore, the mask substrate MS may be protected from overheating and deformation while the mask substrate MS is processed by using the laser beam LB, so that the mask substrate MS may be more precisely processed.

Referring to FIG. 2D, after the second processing process is finished, a gas GS is provided to the mask substrate MS using a gas supply unit 70 provided at a side portion of the chamber CB, and then the gas GS in the chamber CB is absorbed and exhausted outside the chamber CB using a gas absorbing unit 80 provided at the other side portion of the chamber CB. Thus, the physical force is applied to the unprocessed portion AE (refer to FIG. 2C), which is not completely removed from the mask substrate MS during the second processing process, and thus the unprocessed portion AE may be substantially completely removed from the mask substrate MS. In addition, residual products caused by the first and second processing processes in the chamber CB are drained by the gas GS flowing through the chamber CB, and the mask substrate MS is cooled by the gas GS.

Referring to FIGS. 2E and 2F, a vibrator UW_P is disposed on a bottom portion of an etching bath CN and an etchant ET required to etch a metal material fills the etching bath CN. In the present exemplary embodiment, the etchant ET may be, but not limited to, a diluted hydrochloric acid.

Then, the mask substrate MS is dipped into the etchant ET contained in the etching bath CN and the vibrator UW_P is driven to generate ultrasonic wave vibration in the etchant ET. As a result, the physical force is applied to the unprocessed portion AE of the mask substrate MS by the ultrasonic wave vibration, and thus the unprocessed portion AE may be substantially completely removed from the mask substrate MS. In addition, when the first and second processing processes are performed while the ultrasonic wave vibration is applied to the mask substrate MS, an oxide layer formed on the surface of the mask substrate MS may be removed.

As described above, when the processing processes are performed on the mask substrate MS and the unprocessed portion AE is substantially completely removed from the mask substrate MS, the openings or holes OP are formed through the mask substrate MS to correspond to the position of the unprocessed portion AE or the first area, thereby manufacturing the mask MK.

As shown in FIG. 2F, in embodiments, the mask MK includes an array of holes OP. In the illustrated embodiment, a first wall is located between two immediately neighboring holes arranged in a column and a second wall is located between two immediately neighboring holes arranged in a row. As shown in FIG. 2, in embodiments, the first wall may have a height (which is a distance in the thickness direction of the mask substrate) greater than that of the second wall.

Figure 3A:
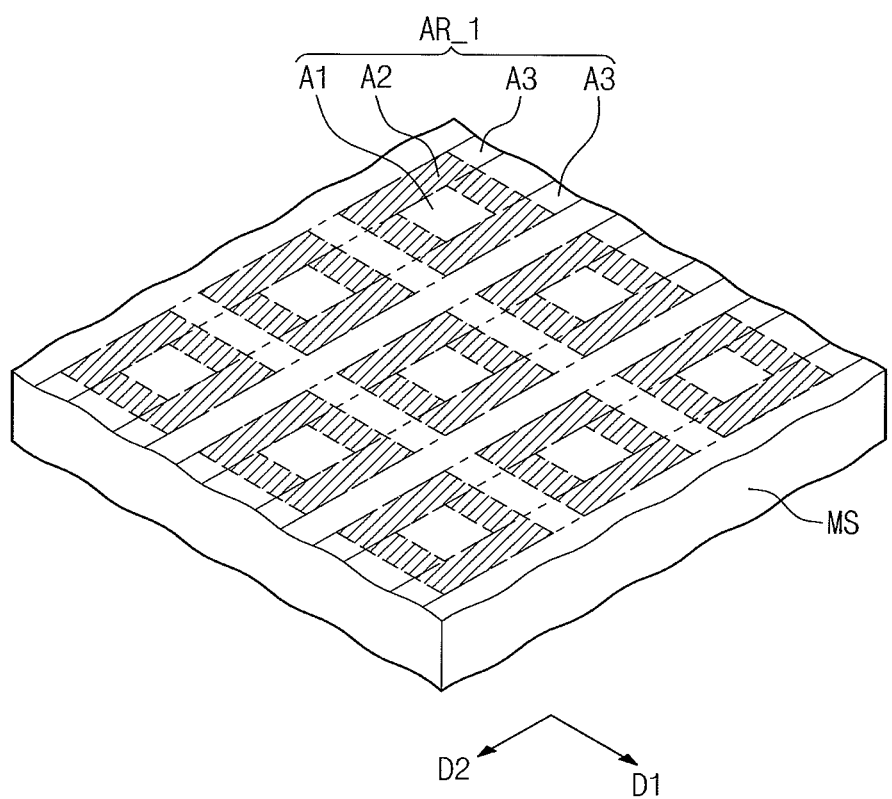
FIGS. 3A to 3C are views showing a method of manufacturing a mask according to another exemplary embodiment of the present disclosure.
Figure 3B:
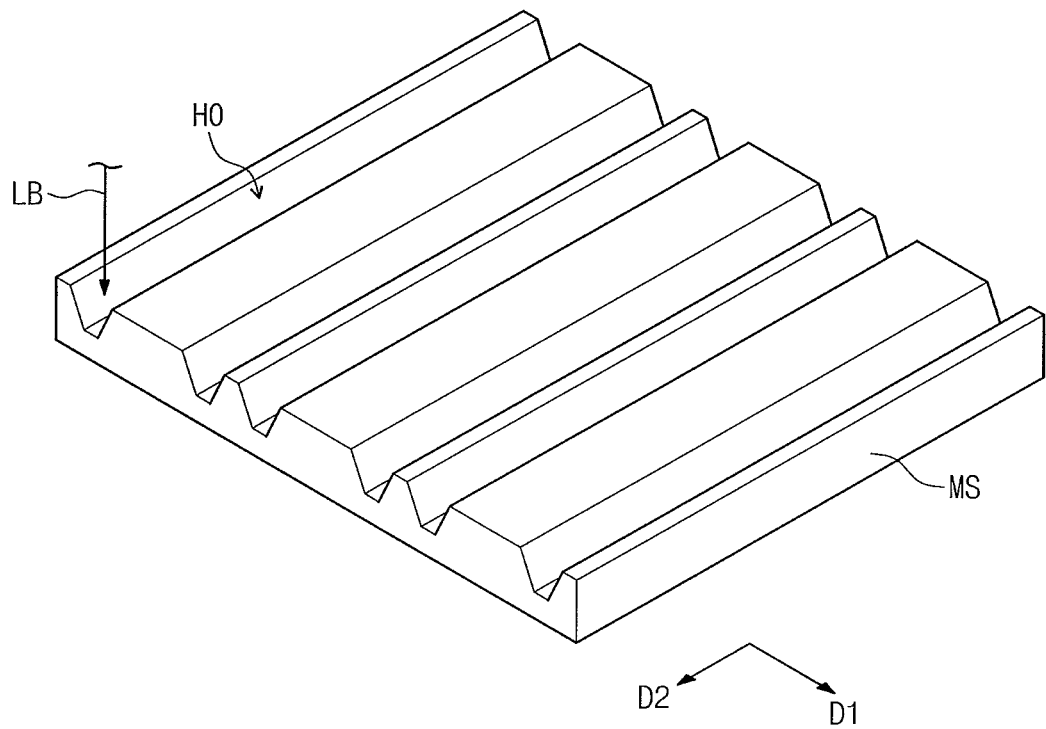
Figure 3C:
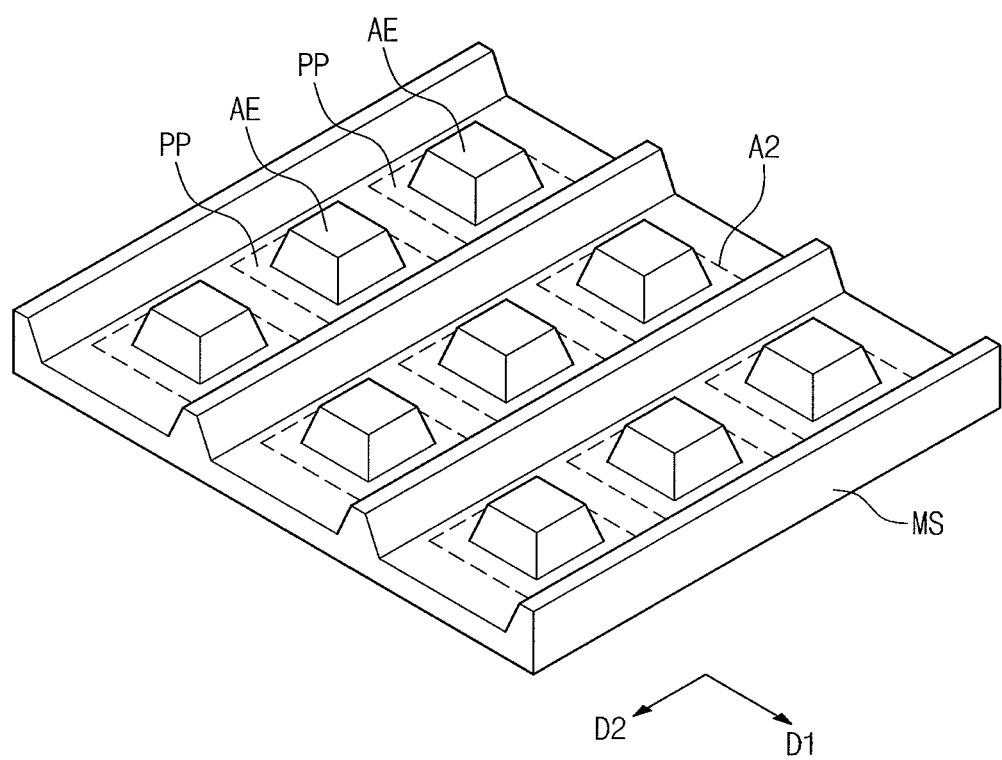

FIGS. 3A to 3C are views showing a method of manufacturing a mask according to another exemplary embodiment of the present disclosure.

Referring to FIG. 3A, a mask substrate MS includes a plurality of processing areas AR_1. The processing areas AR_1 include a plurality of first areas A1, a plurality of second areas A2, and a plurality of third areas A3. The second areas A2 correspond to the first areas A1 in a one-to-one correspondence to surround the first areas A1. In addition, the third areas A3 are extended in a second direction D2, and each of the third areas A3 crosses the second areas arranged in the second direction D2 among the second areas A2.

The reason why the processing areas AR_1 are defined to be different from the processing areas AR (refer to FIG. 2A) is to perform a pre-processing process on the mask substrate MS along the third areas A3 before the laser beam is irradiated onto the mask substrate MS along each second area A2.

Referring to FIGS. 3A and 3B, the laser beam LB is irradiated onto the third areas A3 to perform the pre-processing process on the mask substrate MS. In detail, when the pre-processing process is performed, the laser beam LB is continuously irradiated onto the third areas A3 while moving along the second direction D2 and a direction opposite to the second direction D2, and thus a linear recess H0 is formed in the mask substrate MS.

In the present exemplary embodiment, the linear recess H0 includes side surfaces inclined with respect to the thickness direction of the mask substrate MS when viewed in a cross section as the first and second recesses H1 and H2 shown in FIGS. 2B and 2C. That is, a width of the linear recess H0 becomes smaller as it is closer to the bottom surface of the mask substrate MS.

Referring to FIGS. 3A and 3C, the laser beam LB is further irradiated onto the area of the second areas A2 of the mask substrate MS, which is substantially in parallel to the first direction D1. As a result, the first processing process is performed on the second and third areas A2 and A3 of the mask substrate MS, and thus the unprocessed portion AE remains in the first areas A1.

Then, the laser beam LB is further irradiated onto the processing portion PP corresponding to the second areas A2 as similar to the second processing process described with reference to FIG. 2C. Accordingly, a portion of the processing portion PP is removed to have a depth equal to the depth of the mask substrate MS, and the unprocessed portion AE may be removed from the mask substrate MS.

After that, when the processes described with reference to FIGS. 2D and 2E are performed on the unprocessed portion AE, the unprocessed portion AE partially connected to the mask substrate MS may be substantially completely removed from the mask substrate MS, thereby manufacturing the mask through which openings are formed to correspond to the position of the unprocessed portion AE.

Figure 4:
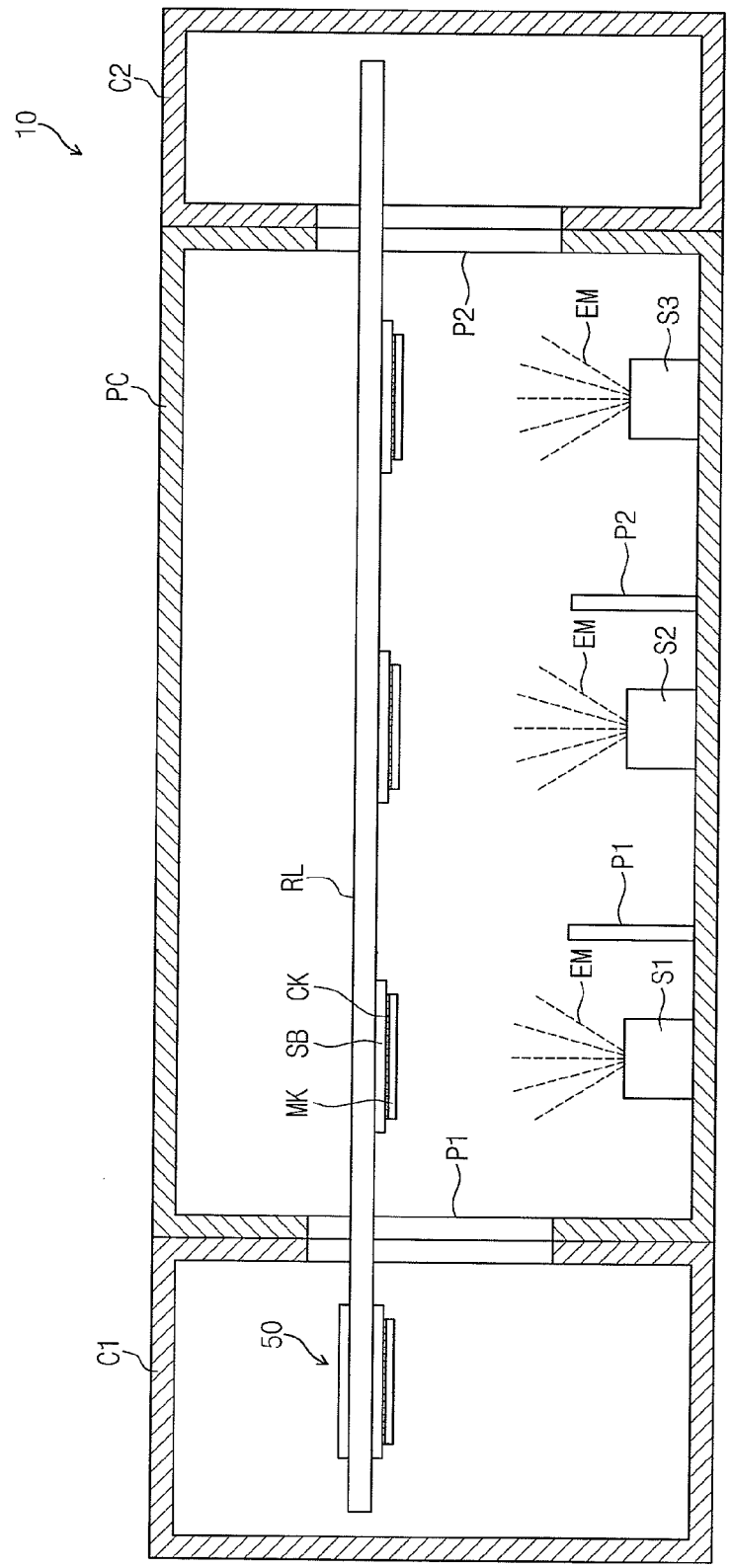
FIG. 4 is a view showing a method of patterning an organic light emitting layer of an organic electroluminescent display device using a mask shown in FIG. 2F.

FIG. 4 is a view showing a method of patterning an organic light emitting layer of an organic electroluminescent display device using a mask shown in FIG. 2F. In FIG. 4, the same reference numerals denote the same elements in FIGS. 2A to 2F, and thus detailed descriptions of the same elements will be omitted.

Referring to FIG. 4, an organic material deposition apparatus 10 is used to pattern an organic light emitting layer on a substrate SB. In the present exemplary embodiment, the organic material deposition apparatus 10 may be used to manufacture an organic electroluminescent display device. The organic material deposition apparatus 10 includes a process chamber PC, a first deposition source S1, a second deposition source S2, a third deposition source S3, a transfer rail RL, a first auxiliary chamber C1, a second auxiliary chamber C2, a mask MK, and a chuck CK.

The process chamber PC provides a space in which an organic material deposition process is performed to deposit an organic material EM from the first to third deposition sources S1 to S3 on the substrate SB. In the present exemplary embodiment, an evaporation method is used as the organic material deposition process. In this case, the organic material EM is heated in the first to third deposition sources S1 to S3 and evaporated, and the evaporated organic material EM is deposited on the substrate SB, thereby forming the organic light emitting layer is formed on the substrate SB.

The process chamber PC includes an entrance portion P1 formed through a side portion thereof and a withdrawal portion P2 formed through the other side portion thereof. The transfer rail RL is disposed crossing the entrance portion P1, the process chamber PC, and the withdrawal portion P2. The substrate SB is coupled to the transfer rail RL by a frame (not shown), and the chuck CK is disposed at an edge of the substrate SB. Accordingly, the substrate SB may be coupled to the mask MK by the chuck CK.

When the substrate SB and the mask MK are loaded into the process chamber PC through the entrance portion P1 by the transfer rail RL, the organic material EM generated from the first to third deposition sources S1 to S3 is deposited on the substrate SB after passing through the opening OP (refer to FIG. 2F) of the mask MK. Thus, the organic material EM is deposited on a predetermined position on the substrate SB by the mask MK, and the organic light emitting layer formed of the organic material EM deposited on the substrate SB is patterned by using the mask MK.

Then, the substrate SB and the mask MK are transferred to the second auxiliary chamber C2 through the withdrawal portion P2, and the process of patterning the organic light emitting layer on the substrate SB using the mask MK is completed.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of manufacturing a mask, comprising:
   providing a mask substrate including a first area and a second area surrounding the first area when viewed in a thickness direction of the mask substrate;
   irradiating a laser beam on the mask substrate to at least partly remove a material of the second area, wherein a recess is formed in the second area by irradiating the laser beam onto the second area and the recess comprises a surface inclined with respect to the thickness direction of the mask substrate when viewed in a cross section; and
   applying a physical force to the mask substrate unprocessed portion to separate the first area from the mask substrate, thereby forming an opening through the mask substrate, wherein the second area is extended in a first direction and a second direction crossing the first direction, and each of the first and second areas is provided in a plural number in the mask substrate, wherein the irradiating the laser beam comprises a pre-processing process on the mask substrate, wherein the laser beam is continuously irradiated onto a third area encompassing a portion of each of two immediately neighboring second areas when the pre-processing process is performed, and the third area is extended in the second direction, and wherein the laser beam is irradiated onto an area of the second area when the laser beam is irradiated on to the second area, and the area of the second area is substantially in parallel to the first direction.

2. The method of claim 1, wherein the physical force is applied to the mask substrate by applying an ultrasonic wave to the mask substrate.

3. The method of claim 2, wherein the mask substrate comprises a metal material and the ultrasonic wave is applied while the mask substrate is dipped into a solution containing an acid.

4. The method of claim 1, wherein the physical force is applied to the mask substrate by supplying a gas to the mask substrate.

5. The method of claim 1, wherein the laser beam is irradiated several times onto the second area to remove the material from a surface thereof along the thickness direction of the mask substrate.

6. The method of claim 5, wherein irradiating the laser beam comprises moving the laser beam along at least two different directions.

7. The method of claim 5, wherein a volume of the recess formed in the second area is smaller than a volume of the first area.

8. The method of claim 7, wherein the recess is tapered in when viewed in a cross section.

9. The method of claim 1, wherein after the laser beam is irradiated onto the third area, the laser beam is irradiated onto the second area.

10. The method of claim 1, wherein the mask is configured to be used to pattern an organic light emitting layer of an organic electroluminescent display device.

* * * * *